(12) United States Patent
Lee

(10) Patent No.: US 7,838,761 B2
(45) Date of Patent: Nov. 23, 2010

(54) METHOD FOR MANUFACTURING SOLAR CELL AND SOLAR CELL MANUFACTURED BY THE METHOD

(75) Inventor: Seongeun Lee, Seoul (KR)

(73) Assignee: LG Electronics Inc., Seoul (KR)

(*) Notice: Subject to any disclaimer, the term of this patent is extended or adjusted under 35 U.S.C. 154(b) by 29 days.

(21) Appl. No.: 12/515,895

(22) PCT Filed: Oct. 25, 2007

(86) PCT No.: PCT/KR2007/005276

§ 371 (c)(1),
(2), (4) Date: May 21, 2009

(87) PCT Pub. No.: WO2008/062953

PCT Pub. Date: May 29, 2008

(65) Prior Publication Data

US 2010/0018573 A1 Jan. 28, 2010

(30) Foreign Application Priority Data

Nov. 22, 2006 (KR) .................. 10-2006-0115892

(51) Int. Cl.
*H01L 31/00* (2006.01)
*H01L 21/00* (2006.01)
(52) U.S. Cl. ................. 136/255; 438/87
(58) Field of Classification Search ............ 136/255, 136/256; 438/87
See application file for complete search history.

(56) References Cited

U.S. PATENT DOCUMENTS 4,322,571 A * 3/1982 Stanbery .............. 136/255
5,956,572 A 9/1999 Kidoguchi et al.
5,994,641 A 11/1999 Kardauskas
6,043,425 A 3/2000 Assad
6,275,295 B1 8/2001 Sopori

FOREIGN PATENT DOCUMENTS

| JP | 2003-332605 A | 11/2003 |
|---|---|---|
| JP | 2004-103736 A | 4/2004 |
| WO | WO-2004/023567 A2 | 3/2004 |

OTHER PUBLICATIONS

Lee et al., "Effect of Design Parameters on the Efficiency of the Solar Cells Fabricated Using SOI Structure," *Korean Journal of Materials Research*, vol. 9, No. 9, 1999, pp. 890-895.

* cited by examiner

*Primary Examiner*—Jeffrey T Barton
(74) *Attorney, Agent, or Firm*—Birch, Stewart, Kolasch & Birch, LLP

(57) ABSTRACT

A method for manufacturing a solar cell includes (S1) forming, on a first conductive semiconductor substrate, a second conductive semiconductor layer having an opposite conduction type by means of ion implantation to form a pn junction in an interface thereof; (S2) treating an alkali solution on the second conductive semiconductor layer for texturing; (S3) forming an antireflection film on the textured second conductive semiconductor layer; (S4) forming a front electrode to pass through a partial region of the antireflection film and connect to a part of the second conductive semiconductor layer; and (S5) forming a rear electrode at an opposite side to the front electrode with the first conductive semiconductor substrate being interposed therebetween such that the rear electrode is connected to the first conductive semiconductor substrate. The second conductive semiconductor layer, namely an emitter layer, functions as an etch stop layer.

9 Claims, 2 Drawing Sheets

[Fig. 1]
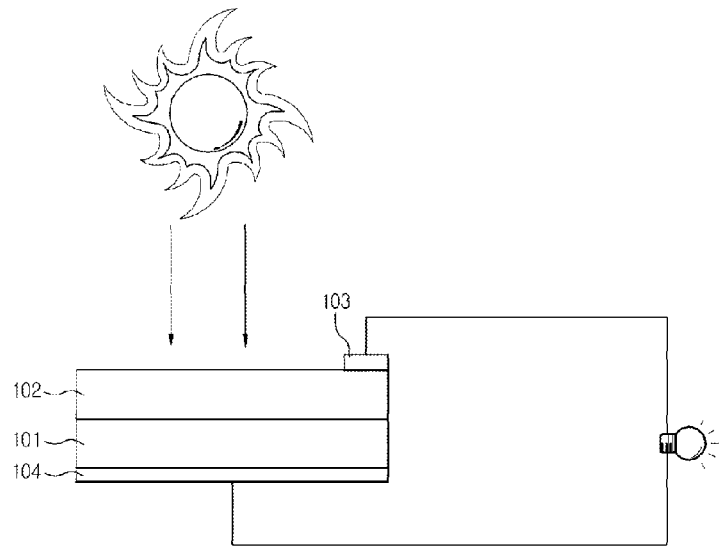
[Fig. 2]
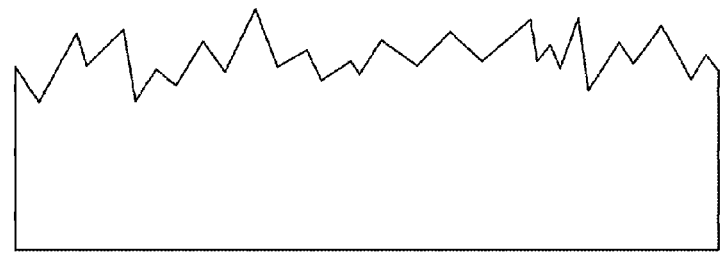
[Fig. 3]
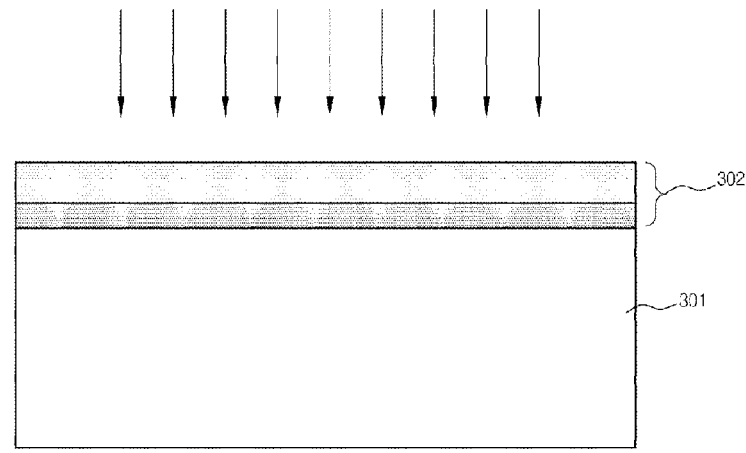
[Fig. 4]
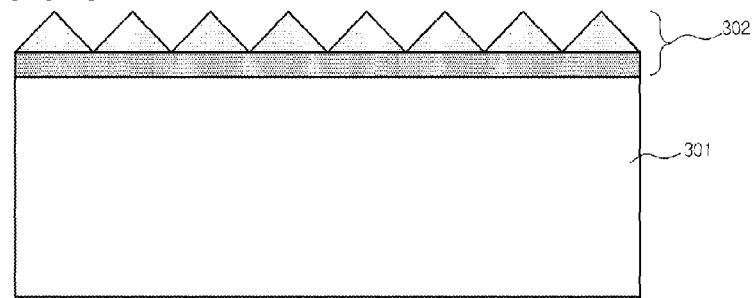

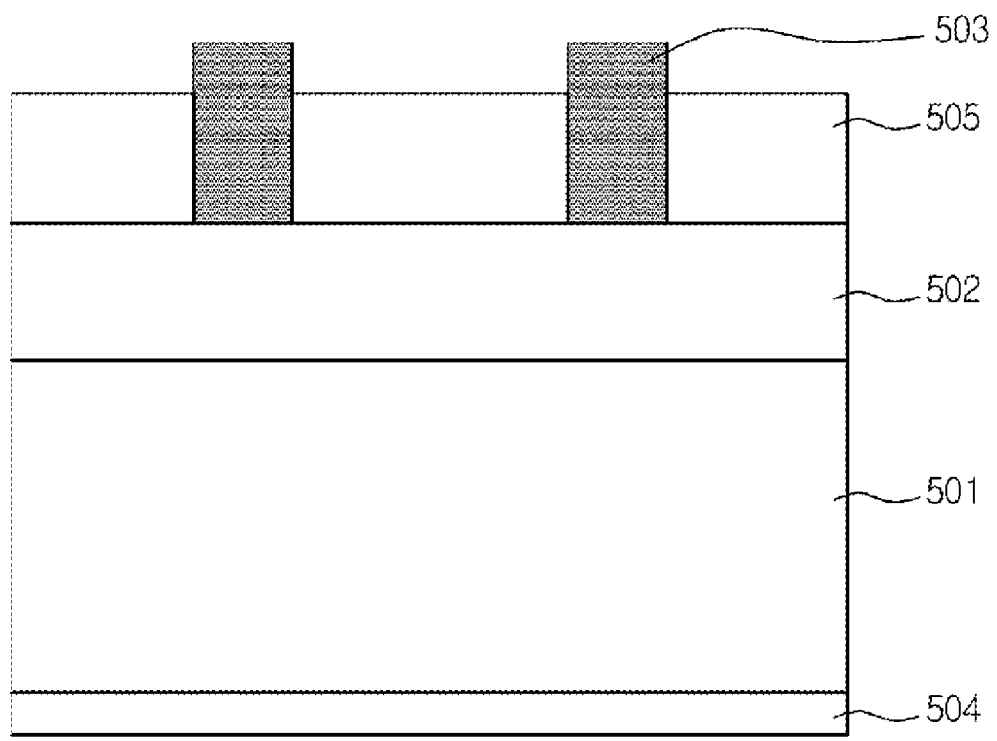
[Fig. 5]

METHOD FOR MANUFACTURING SOLAR CELL AND SOLAR CELL MANUFACTURED BY THE METHOD

TECHNICAL FIELD

The present invention relates to a method for manufacturing a solar cell, and a solar cell manufactured by the method; and more particularly to a method for manufacturing a solar cell, which allows to realize a uniform surface by evenly etching a wafer during surface texturing of a silicon wafer and also to simplify its manufacture process and reduce a production cost since a PSG removing process and an edge isolation process are not needed, and a solar cell manufactured by the method.

BACKGROUND ART

Recently, as exhaustion of existing energy resources such as petroleum and coal is estimated, interests on alternative energies for substituting them are more increased. Among the alternative energies, a solar cell is particularly spotlighted since its energy resource is abundant and it does not cause any environmental pollution. A solar cell is classified into a solar heat cell that generates a vapor required for rotating a turbine using a solar heat, and a solar light cell that converts photons into electric energy using the properties of a semiconductor. Generally, a solar cell calls the solar light cell (hereinafter, the term 'solar cell' is used).

Referring to FIG. 1 showing a basic structure of a solar cell, the solar cell has a junction structure of a p-type semiconductor 101 and a n-type semiconductor 102 like a diode. If photons are input to the solar cell, the photons are reacted with materials of the semiconductor to generate electrons of (−) charge and holes of (+) charge caused by removal of the electrons, thereby allowing flow of electric current as they are moving. It is called photovoltaic effect, and the solar cell gives power using this photovoltaic effect.

Such output features of a solar cell are generally evaluated by measuring an output current-voltage curve using a solar simulator. On the curve, a point at which a multiplication $Ip \times Vp$ of an output current Ip and an output voltage Vp is maximum is called a maximum output Pm. Also, a value obtained by dividing Pm by a total optical energy (SI: S is an area of an element, I is an intensity of light irradiated to the solar cell) input to the solar cell is defined as conversion efficiency $\eta$. In order to increase the conversion efficiency $\eta$, it is required to increase short-circuit current Isc (an output current at V=0 on the current-voltage curve) or open voltage Voc (an output voltage at I=0 on the current-voltage curve), or to increase FF (fill factor) indicating how the output current-voltage curve is close to a square shape. As FF has a value closer to 1, the output current-voltage curve approximates to an ideal square shape, and it means that the conversion efficiency $\eta$ is increased.

Among three factors determining the efficiency of a solar cell, the short-circuit current Isc is determined based on absorptance or reflectance of the solar cell with respect to a light irradiated to the solar cell. Thus, there are many efforts to decrease reflectance, and representatively, there is used a method for forming an anti-reflection film on a front surface of a solar cell to which photons are irradiated or a method for minimizing an area of a front electrode. In addition, there is used a method for reducing reflectance by etching a front surface of a silicon wafer to form unevenness thereon, which is called 'texturing'.

However, a polycrystalline silicon wafer shows irregular surface texturing as shown in FIG. 2 due to different etching rates depending on crystal surfaces, so the reflectance is not so greatly reduced using the texturing process. In this reason, there have been made many endeavors to solve the above problem, and the present invention is made based on the above.

DISCLOSURE OF INVENTION

Technical Problem

The present invention is designed to solve the problems of the prior art, and therefore it is an object of the present invention to provide an improved method for manufacturing a solar cell, which allows to realize a uniform surface by evenly etching a wafer during surface texturing of a silicon wafer and also to simplify its manufacture process and reduce a production cost since a PSG removing process and an edge isolation process are not needed; and a solar cell manufactured by the method.

Technical Solution

In order to accomplish the above object, the present invention provides a method for manufacturing a solar cell, which includes (S1) forming, on a first conductive semiconductor substrate, a second conductive semiconductor layer of an opposite conduction type by means of ion implantation to form a pn junction in an interface thereof; (S2) treating an alkali solution on the second conductive semiconductor layer for texturing; (S3) forming an antireflection film on the textured second conductive semiconductor layer; (S4) forming a front electrode to pass through a partial region of the antireflection film and connect to a part of the second conductive semiconductor layer; and (S5) forming a rear electrode at an opposite side to the front electrode with the first conductive semiconductor substrate being interposed therebetween such that the rear electrode is connected to the first conductive semiconductor substrate.

The alkali solution representatively includes an alkali such as sodium hydroxide, potassium hydroxide and ammonium hydroxide, and isopropyl alcohol and DI water (Deionized water) are mixed to the alkali. Preferably, the alkali solution has a pH of 8 to 14, and a processing time of the alkali solution is 10 to 90 minutes.

Preferably, the antireflection film is formed using silicon nitride, and the antireflection film is formed using PECVD (PlasmaEnhanced Chemical Vapor Deposition) or CVD (Chemical Vapor Deposition).

Preferably, the first conductive semiconductor substrate is a ptype silicon substrate, and the second conductive semiconductor layer is an ntype emitter layer.

In another aspect of the present invention, there is also provided a solar cell manufactured using the above method.

BRIEF DESCRIPTION OF THE DRAWINGS

Other objects and aspects of the present invention will become apparent from the following description of embodiments with reference to the accompanying drawing in which:

FIG. 1 is schematic view showing a basic structure of a solar cell;

FIG. 2 is a schematic diagram showing a surface of a silicon wafer after texturing using an alkali solution;

FIG. 3 is a schematic diagram showing an emitter layer formed on one surface of the silicon wafer by means of ion implantation;

FIG. 4 is a schematic diagram showing the silicon wafer of FIG. 3, which is textured using an alkali solution; and FIG. 5 is a schematic diagram showing a solar cell manufactured by the method of the present invention.

BEST MODE FOR CARRYING OUT THE INVENTION

Hereinafter, a preferred embodiment of the present invention will be described in detail with reference to the accompanying drawings.

A method for manufacturing a solar cell according to the present invention allows a wafer surface to be uniformly textured in a way of forming an emitter layer by means of ion implantation before texturing a silicon wafer, thereby capable of greatly reducing reflectance against photons.

In the method for manufacturing a solar cell according to the present invention, on a first conductive semiconductor substrate, a second conductive semiconductor layer of an opposite conduction type, namely an emitter layer, is formed by means of ion implantation to form a p-n junction on their interface. Ion implantation is one of representative surface reforming techniques for forming a reformed layer on a surface by accelerating ions using high energy and then implanting the ions into the surface of material. The ion implantation allows easy control of implantation depth, distribution and concentration according to an amount of implanted ions or energy, so it is widely used in a doping process of a semiconductor for IC (Integrated Circuit).

The p-n structure formed as mentioned above receives light and then generates electric current by means of photovoltaic effect. Representatively, the first conductive semiconductor substrate is a ptype silicon substrate doped with Group 3 element such as B, Ga and In, and the second conductive semiconductor layer is a ntype emitter layer doped with Group 5 element such as P, As and Sb. The ptype silicon substrate and the ntype emitter layer may be joined to form a pn junction. However, the pn structure of the present invention is not limited thereto.

FIG. 3 is a schematic diagram showing that a second conductive semiconductor layer 302 is formed on one surface of a first conductive semiconductor substrate by means of ion implantation. In FIG. 3, arrows represent a direction of ion implantation. If ions are implanted in the arrowed direction, a region to which ions are implanted shows an opposite conduction type to the other region 301 of the first conductive semiconductor substrate, so this region forms a second conductive semiconductor layer 302. Ions are implanted into a predetermined depth of a wafer, and the depth of ion implantation is determined based on ion implanting energy. Generally, the ion implanting energy is 100 KeV to 3 MeV, which results in an ion implantation depth of 0.5 to 10 μm. Also, an amount of implanted ions is generally $1 \times 10^{14}/cm^2$ to $5 \times 10^{16}/cm^2$. In addition, ions are not implanted with regular concentration from the surface of the semiconductor substrate, but ions are substantially not implanted to a predetermined depth from the surface and mostly implanted to a region exceeding the depth such that ions are abundant in the region exceeding the depth. Thus, even in the second conductive semi-conductor layer 302, ion concentration is suddenly changed between the layer having substantially no ion (a light region of the emitter layer in FIG. 3) and the layer having abundant ions (a dark region of the emitter layer in FIG. 3).

If the second conductive semiconductor layer 302 is formed by means of ion implantation, an alkali solution is treated on the second conductive semiconductor layer 302 for texturing.

FIG. 4 is a schematic diagram showing that the semiconductor substrate of FIG. 3 is textured using an alkali solution. The alkali solution well etches a region with a low ion concentration in the second conductive semiconductor substrate 302, but it does not easily etch a region with a high ion concentration. Thus, the region with a high ion concentration in the second conductive semiconductor layer 302 functions as an etch stop layer such that etching is conducted only to the region with a low ion concentration, thereby ensuring uniform etching of the wafer surface as shown in FIG. 4.

In the texturing, the alkali solution may representatively include sodium hydroxide, potassium hydroxide, or ammonium hydroxide, and generally isopropyl alcohol and DI water (Deionized Water) are mixed to such an alkali solution. The alkali solution preferably has pH of 8 to 14, and a processing time of the alkali solution is preferably 10 to 90 minutes.

After texturing, an antireflection film is formed on the second conductive semi-conductor layer. The antireflection film is used for reducing reflectance of a solar cell.

The antireflection film uses representatively a silicon nitride layer, and it is commonly formed using CVD (Chemical Vapor Deposition) or PECVD (PlasmaEnhanced Chemical Vapor Deposition). The antireflection film may be formed directly on the second conductive semiconductor layer, but the antireflection film may also be formed on a passivating layer that is formed on the second conductive semiconductor layer before forming the antireflection film.

After forming the anti-reflection film, a front electrode and a rear electrode are formed. FIG. 5 is a schematic diagram showing a solar cell manufactured by the method of the present invention. As shown in FIG. 5, the front electrode 503 is formed to pass through a partial region of the anti-reflection film 505 and then connect to a part of the second conductive semiconductor layer 502. Also, the rear electrode 504 is formed at an opposite side to the front electrode 503 with the first conductive semi-conductor substrate 501 being interposed therebetween, such that the rear electrode 504 is connected to first conductive semiconductor substrate 501. If loads are applied to these electrodes 503, 504, electric energy generated from the solar cell may be used.

The front electrode 503 representatively adopts a silver electrode since the silver electrode has excellent electric conductivity. The rear electrode 504 representatively adopts an aluminum electrode since the aluminum electrode has good conductivity and allows good adhesion due to good affinity with silicon. In addition, the aluminum electrode corresponds to Group 3 element, which forms a p+ layer, namely BSF (Back Surface Field), at a contact surface with the silicon substrate such that carriers are not disappeared but collected on the surface, thereby enhancing efficiency of the solar cell.

The front electrode 503 may be formed in a way of coating an electrodeforming paste on the antireflection film in a predetermined pattern and then thermally treating it, as an example. Due to this thermal treatment, the front electrode punches through the antireflection film and connects to the second conductive semiconductor layer. Also, the rear electrode 504 may be formed in a way of coating an electrodeforming paste on the first conductive semiconductor substrate in a predetermined pattern and then thermally treating it, as an example. Due to this thermal treatment, materials of the rear electrode are doped to the first conductive semiconductor substrate to form BSF.

The front electrode 503 and the rear electrode 504 may be formed in a reversed order, and it is also possible to coat pastes of the front and rear electrodes respectively and then thermally treating them at the same time.

It should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

INDUSTRIAL APPLICABILITY

The method for manufacturing a solar cell according to the present invention gives the following effects. First, since texturing of a silicon wafer is conducted after forming an emitter layer by ion implantation, the emitter layer functions as an etch stop layer, thereby capable of realizing a uniform surface of wafer and greatly reducing reflectance against photons. Also, the method of the present invention does not need a PSG removing process and an edge isolation process, thereby capable of simplifying its production process and reducing a manufacture cost.

The invention claimed is:

1. A method for manufacturing a solar cell, comprising:
    forming, on a surface of a first conductive semiconductor substrate of a first conductive type, a second conductive semiconductor layer of a second conduction type opposite to the first conductive type and having a first portion and a second portion having an ion concentration higher than that of the first portion, in which ions are implanted by means of ion implantation;
    etching the first portion of the second conductive semiconductor, to texture the first portion;
    forming a first electrode connected to the second conductive semiconductor layer; and
    forming a second electrode connected to the first conductive semiconductor substrate,
    wherein a distance from an outer surface of the second conductive semiconductor layer to the first portion is less than a distance from the outer surface to the second portion.

2. The method for manufacturing a solar cell according to claim 1, wherein the texturing of the first portion etches the first portion using alkali solution and the alkali solution includes an alkali selected from the group consisting of sodium hydroxide, potassium hydroxide and ammonium hydroxide.

3. The method for manufacturing a solar cell according to claim 1, further comprising forming an antireflection film on the textured second conductive semiconductor layer, and the first electrode is connected to a portion of the second conductive semiconductor layer passing through a portion of the antireflection film.

4. The method for manufacturing a solar cell according to claim 2, wherein a processing time of the alkali solution is 10 to 90 minutes.

5. The method for manufacturing a solar cell according to claim 3, wherein the antireflection film is formed using silicon nitride.

6. The method for manufacturing a solar cell according to claim 3, wherein the antireflection film is formed using PECVD (Plasma_Enhanced Chemical Vapor Deposition) or CVD (Chemical Vapor Deposition).

7. The method for manufacturing a solar cell according to claim 1, wherein the first conductive type is p type, and the second conductive type is an n type.

8. A solar cell comprising:
    a first conductive semiconductor substrate of a first conductive type;
    a second conductive semiconductor layer formed in the first conductive semiconductor substrate, having a first portion and a second portion having an ion concentration higher than that of the first portion, in which ions are implanted, and having a second conductive type opposite to the first conductive type;
    a first electrode connected to the second conductive semiconductor layer; and
    a second electrode connected to the first conductive semiconductor substrate,
    wherein a distance from an outer surface of the second conductive semiconductor layer to the first portion is less than a distance from the outer surface to the second portion and the first portion is textured.

9. The solar cell of claim 8, further comprising an antireflection film on the second conductive semiconductor layer, and the first electrode is connected to the second conductive semiconductor layer passing through a portion of the antireflection film.

* * * * *